US006657358B2

(12) United States Patent
Perner

(10) Patent No.: US 6,657,358 B2
(45) Date of Patent: Dec. 2, 2003

(54) POWER SUPPLY INCLUDING PYROELECTRIC CAPACITOR

(75) Inventor: Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 253 days.

(21) Appl. No.: 09/892,251

(22) Filed: Jun. 26, 2001

(65) Prior Publication Data

US 2002/0195952 A1 Dec. 26, 2002

(51) Int. Cl.[7] .................................................. H02N 1/00
(52) U.S. Cl. ........................ 310/300; 310/306; 290/1 R; 322/2 A
(58) Field of Search ................................. 310/300, 306; 322/2 A; 290/1 R

(56) References Cited

U.S. PATENT DOCUMENTS

| | | | | |
|---|---|---|---|---|
| 4,024,560 A | * | 5/1977 | Miller et al. ................ | 257/252 |
| 4,365,106 A | * | 12/1982 | Pulvari ....................... | 136/206 |
| 4,453,405 A | * | 6/1984 | Zemel ........................ | 73/204.23 |
| 4,608,865 A | * | 9/1986 | Muller et al. ............... | 73/204.23 |
| 4,626,687 A | * | 12/1986 | Nara et al. .................. | 250/338.3 |
| 4,647,836 A | * | 3/1987 | Olsen .......................... | 322/2 A |
| 4,792,667 A | * | 12/1988 | Chen ........................... | 235/488 |
| 5,860,741 A | * | 1/1999 | Tsao et al. ................... | 374/129 |
| 6,061,464 A | * | 5/2000 | Leger .......................... | 382/124 |
| 6,528,898 B1 | * | 2/2003 | Ikura et al. .................. | 290/1 R |

FOREIGN PATENT DOCUMENTS

| | | | | |
|---|---|---|---|---|
| JP | 10-187954 | * | 7/1998 | ............ B06T/1/00 |
| SU | 1342200 A1 | * | 10/1995 | ............ G01M/3/16 |

OTHER PUBLICATIONS

Pyroelectric Technique for Measurement of Thermal Conductivity, Jun. 1982, IBM Technical Disclosure Bulletin; vol. 25, Issue 1, pp. 69–74.*

Y.L. Wang, "Intelligent sensors for the next century", Third International Conference on Thin Film Physics and Applications, SPIE vol. 3175–12, pp. 70–76 (Feb. 1998).

* cited by examiner

Primary Examiner—Thomas M. Dougherty

(57) ABSTRACT

A regulated power supply includes a pyroelectric capacitor. Such a power supply can be incorporated into an integrated circuit.

19 Claims, 3 Drawing Sheets

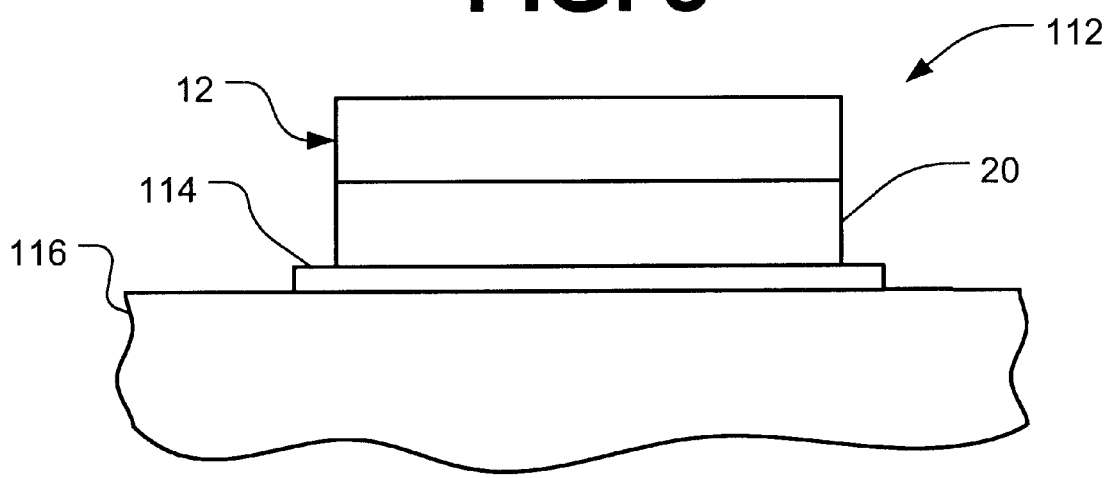
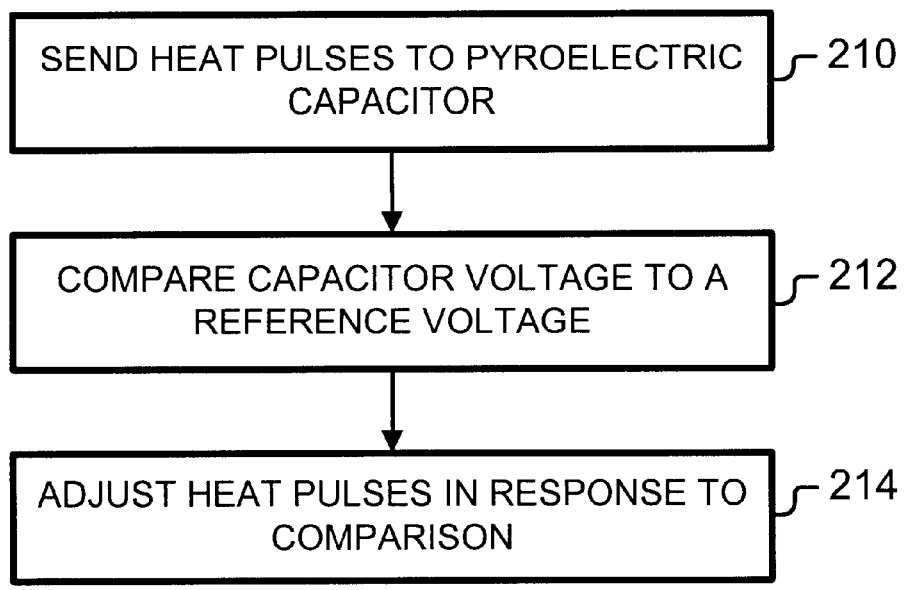

POWER SUPPLY INCLUDING PYROELECTRIC CAPACITOR

BACKGROUND

The invention relates generally to power supplies. More specifically, the present invention relates to a regulated power supply that can be incorporated into an integrated circuit.

Miniaturization and integration are ongoing trends in integrated circuits. Semiconductor fabrication techniques are used to produce integrated circuits having millions of transistors on a single chip. With each year that passes, the number of transistors is increased.

High voltage power supplies for integrated circuits, however, have been difficult to miniaturize. Traditional magnetic-based voltage transformers are too large in size, as they cannot be scaled down for incorporation into integrated circuits. Voltage doublers are also too large, as they typically need too many stages to generate a high voltage (e.g., 100 volts) from a low voltage (e.g., 5 volts). Piezoelectric transformers can provide stepped up voltages on a millimeter scale; however, they are still too large in size to be incorporated into integrated circuits.

Field-emitting memory devices, radiation detection sensors and many other chip-based devices are usually operated at high voltages. Many of these devices could be dramatically reduced in size if their power supplies could be miniaturized sufficiently for incorporation into integrated circuits.

SUMMARY

According to one aspect of the present invention, a regulated power supply includes a pyroelectric capacitor. Such a power supply can be incorporated into an integrated circuit. Other aspects and advantages of the present invention will become apparent from the following detailed description, taken in conjunction with the accompanying drawing, illustrating by way of example the principles of the invention.

BRIEF DESCRIPTION OF THE DRAWINGS

FIG. 3 is an illustration of a heater and pyroelectric capacitor as part of an integrated circuit.

FIG. 5 is a flow diagram of a method of using a pyroelectric capacitor to generate a regulated voltage.

DETAILED DESCRIPTION

Figure 1:
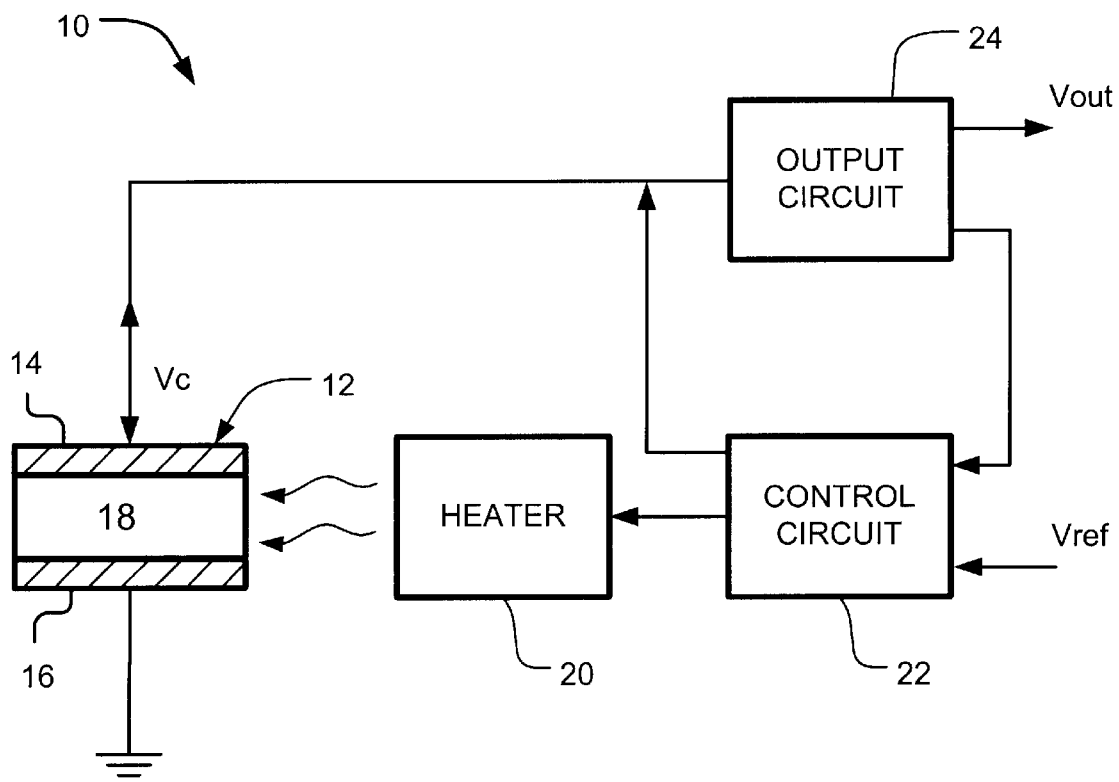
FIG. 1 is a block diagram of a power supply according to the present invention.

As shown in the drawings for purposes of illustration, the present invention is embodied in a regulated power supply including a pyroelectric capacitor. The power supply provides a regulated output voltage with a maximum power capability that is proportional to crystal size. Voltages between 20 and 200 volts may be generated from a low voltage (e.g., 3–10 volts), with temperature increases in the range of 1–5° C., depending upon the type of pyroelectric material used in the pyroelectric capacitor. The small size, simplicity of design, and high voltage range allow the power supply to be incorporated into integrated circuits.

Referring to FIG. 1, the power supply 10 includes a pyroelectric capacitor 12 having first and second metal plates 14 and 16 and a dielectric 18 between the plates 14 and 16. The dielectric 18 is made of a pyroelectric material, which contains a built-in polarization that is temperature-dependent. The polarization is temperature-dependent in that a change in temperature causes the strength of the polarization to change. The pyroelectric material may be a thin, flat crystal having an area (A), a thickness (d) and a direction of polarization in the direction of the thickness of the crystal. The pyroelectric capacitor 12 also has an area (A), a thickness (d), and a relative dielectric constant and a polarization that are characteristic of the specific pyroelectric material.

Changes in polarization cause an external current to flow to balance the changes in polarization. The voltage (Vc) on the metal plates 14 and 16 results from the capacitance of the pyroelectric capacitor 12, circuit impedance connected to the two metal plates 14 and 16, and temperature conditions applied to the pyroelectric material. In general, as the temperature of the pyroelectric material is increasing, a positive displacement current flows out of the pyroelectric material and causes the capacitor voltage (Vc) to rise. In general, as the temperature of the pyroelectric material is decreasing, current flows into the pyroelectric material and causes the capacitor voltage (Vc) to decrease. The displacement current (I) is induced along the axis of polarization as I=pA(dT/dt), where p is a material-dependent pyroelectric coefficient, A is the crystal area normal to the axis of polarization, and dT/dt is the rate of change of temperature. Thus displacement current and the capacitor voltage (Vc) are not dependent on the temperature, but rather on the change in temperature as a function of time.

The dielectric thickness (d) is a design parameter: increasing the thickness of a pyroelectric material reduces the capacitance and increases the maximum voltage capability, while reducing the thickness of the pyroelectric material increases the capacitance and reduces the maximum voltage capability. The maximum voltage capability also depends on the particular pyroelectric material that is used. For example, an $LiNbO_3$ crystal can yield 33 volts per degree centigrade increase in temperature; an $LiTaO_3$ crystal can yield 46 volts per degree centigrade; and an $Li_2SO_2H_2O$ can yield 141 volts per degree centigrade. These crystals make it possible for the voltage generator 12 to generate 20 to 200 volts with a 1–5° C. increase in the temperature of the pyroelectric material. As will be seen later, only a relatively low voltage (e.g., 1.5–10 volts) is needed to generate these higher voltages.

The power supply 10 further includes a heater 20 in close proximity to the pyroelectric capacitor 12. The heater 20 causes small, uniform temperature variations in the pyroelectric material. For example, the heater 20 may be a heat-dissipative element (e.g., a resistor) in contact with the pyroelectric capacitor 12. Temperature of the pyroelectric material is increased when power is supplied to the dissipative element, and the temperature of the pyroelectric material is decreased when the power to the dissipative element is cut off.

Figure 2:
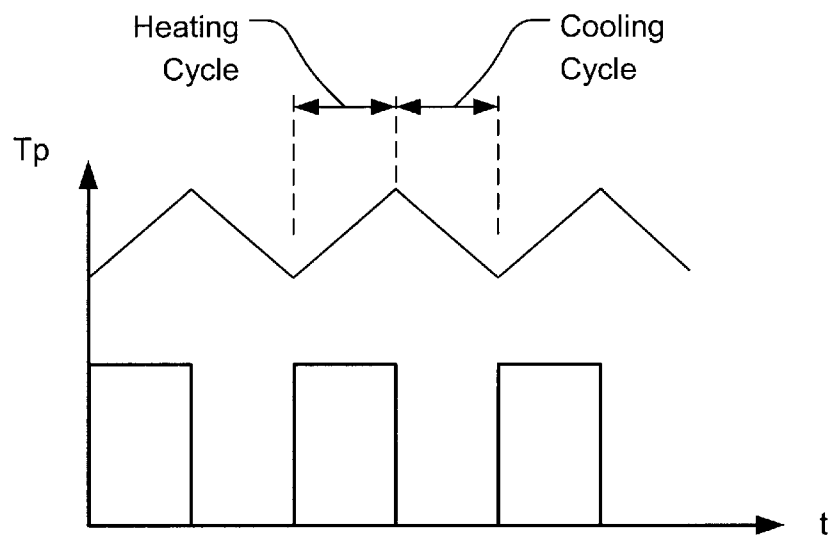
FIG. 2 is a diagram of capacitor temperature for the power supply.

Additional reference is made to FIG. 2. A control circuit 22 causes the heater 20 to vary the temperature of the pyroelectric material 16. A circuit 22 for a dissipative element may send pulses (P) of electrical power to the dissipative element. The electrical pulses cause the dissipative element to send pulses of heat to the pyroelectric material 16. The heat pulses cause the temperature (Tp) of the pyroelectric material to increase and current to flow out of the pyroelectric material (during time periods referred to as "heating cycles"). During the times between pulses ("cooling cycles"), heat from the pyroelectric material is dissipated into the ambient environment, and the pyroelectric material cools towards the temperature of the ambient environment. A series of heating and cooling cycles is preferred over one long heating cycle (a long heating cycle could cause the an over-temperature condition on the integrated circuit chip).

Amplitude and frequency of the electrical pulses also determine the magnitude of the capacitor voltage (Vc). The frequency may be relatively low, on the order of kilo-Hertz or lower (since thermal time constants are in the kilo-Hertz range). The amplitude of the heat pulses is related to the maximum temperature that the pyroelectric capacitor 12 can support. Higher temperatures of the pyroelectric material will result in more efficient cooling periods (e.g., the time period when power to the dissipative element is cut off). Design of the circuit 22 should consider the amount of charge that must be delivered to output load(s) during the heating cycle, and the recovery of the pyroelectric material during the cooling cycle (e.g., between heating pulses). This time relationship is directly related to load voltage.

The control circuit 22 also provides charge recovery during cooling cycles. The current flowing through the pyroelectric material is a displacement current, i.e., it is not a physical current. A physical current flows from the control circuit 22 to the pyroelectric capacitor 12 to satisfy the charge balance relationship driven by changes in the polarization of the pyroelectric material during cooling. When the temperature of the pyroelectric material is increasing, a positive current flows into an output circuit 24. When the pyroelectric material cools, the control circuit 22 returns current to the pyroelectric capacitor 12. The net charge exchange from one temperature cycle is zero, and all the charge supplied to the output is returned during the cooling cycles. Thus the control circuit 22 "recharges" the pyroelectric capacitor 12.

The output circuit 24 is active during heating cycles. When the temperature of the pyroelectric material is rising during a heating cycle, charge from the pyroelectric material flows into the output circuit 24, and the output circuit 24 rectifies the output of the pyroelectric capacitor 12.

Feedback from the output circuit 24 is used to determine the sequence of power pulses from the control circuit 22 to the heater circuit 20. The output voltage (Vout) is compared to a reference voltage (Vref). If the output voltage (Vout) is less than the reference voltage (Vref), power pulses are supplied to the heater 20 to cause the pyroelectric capacitor 12 to supply charge to the output circuit 24 to increase the output voltage (Vout). If the output voltage (Vout) is greater than the reference voltage (Vref), the control circuit 24 does not send power pulses to the heater 20, whereby the pyroelectric capacitor 12 is allowed to cool down toward the ambient temperature. No charge is delivered to the output circuit 24, and the output voltage (Vout) is allowed to decay while the output circuit 24 supplies charge to a load.

The power supply 10 may be used for many different applications. However, its small size, simplicity of design, low power requirements, and high voltage range allow the power supply 10 to be incorporated into integrated circuits.

Reference is now made to FIG. 3, which shows the pyroelectric capacitor 12 and the heater 20 as part of an integrated circuit 112. The heater 20 includes a thin film resistor in contact with the pyroelectric capacitor 12. A thick field oxide 114 may be formed on a silicon substrate 116, the thin film resistor is formed over the field oxide 114, and the pyroelectric capacitor 12 is formed on the thin film resistor. This structure has good thermal coupling between the heater 20 and the pyroelectric capacitor 12. It also has poor thermal coupling to the substrate 116 so that most of the heat pulses from the heater 20 are coupled into the pyroelectric material. A diffused resistor in the substrate costs less to implement but requires more power to heat the pyroelectric material. Transistors (either thin film transistors or transistors in the substrate) may be used instead of resistors to deliver heat to the pyroelectric capacitor 12. Power delivered to the heater 20 may come from the VDD power supply of the integrated circuit 112 or from a separate heater power supply if it is desirable to separate the power sources.

The area configuration of the pyroelectric material may follow the area configuration of the heater 20. If the crystal is bonded to the surface of the integrated circuit, a regular shape (e.g., square or rectangular) is preferred. If a pyroelectric crystal is grown or deposited on the substrate and patterned using a photolithography process, the surface shape of the crystal could be any complex shape that covers the heater 20. During the cooling cycles, heat from the pyroelectric material is dissipated to integrated circuit packaging materials.

The thin film resistor or other heat-dissipative element may be made from almost any resistive material, such as poly silicon or tungsten. If the pyroelectric capacitor crystal is mechanically placed on the chip, adding a conductor to the top of the crystal could be done with a discrete wire or as part of a beam-lead process.

Figure 4:
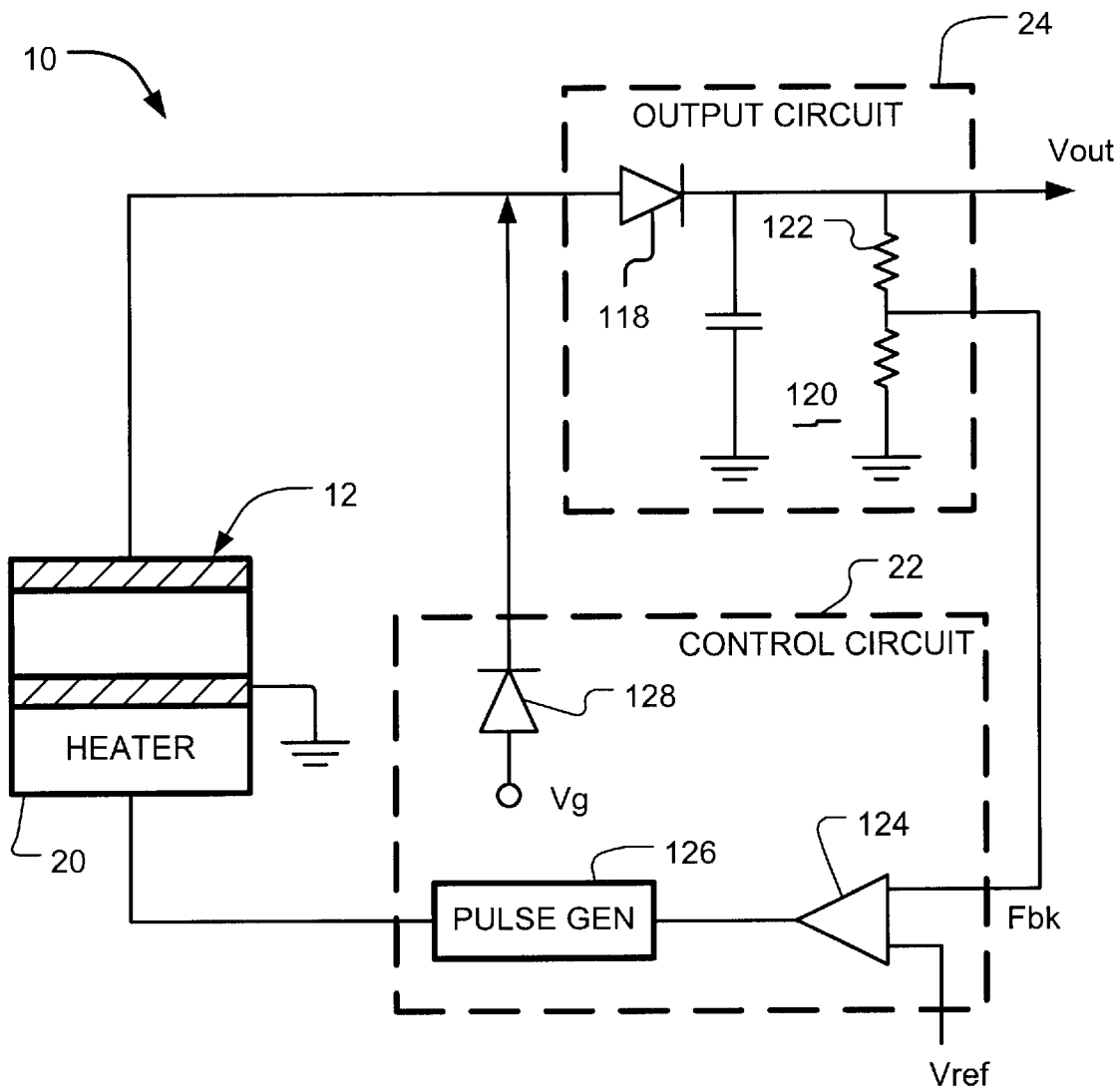
FIG. 4 is an illustration of an embodiment of an integrated circuit power supply.

Reference is now made to FIG. 4, which illustrates a specific embodiment of the power supply for the integrated circuit 112. The control circuit 22 and the output circuit 24 may be fabricated in the silicon substrate 116. The output circuit 24 includes a diode 118 and output filter 120 (e.g., a capacitor and resistors) for rectifying the output of the pyroelectric capacitor 12. The output circuit 24 further includes a sense circuit 122 for sensing a voltage level at an output (Vout) of the output circuit 24, and providing feedback (Fbk) to the control circuit 22. The sense circuit 122 is shown as a resistor ladder, which also forms a part of the output filter 120.

The control circuit 22 includes a comparator 124 for comparing the sensed output voltage to the reference voltage (Vref), and a pulse generator 126 for delivering a series of power pulses to the heater 20 in response to an output from the comparator 124. The pulse generator 126 may include a clock and a gate. The clock generates pulses at a fixed frequency, and the gate allows certain pulses to pass when the output voltage (Vout) is less than the reference voltage (Vref).

A more sophisticated control circuit could be used instead to control the amplitude and frequency of the electrical pulses to the heater 20. For instance, a variable frequency/amplitude generator could be used. Amplitude could be varied to control the instantaneous power delivered to the heater 20 per heating cycle, and the frequency could be varied to control the duration of the heating and cooling periods. Increasing the heating duty cycle (that is, increasing the ratio of heating cycle period to the period of a full cycle) will increase the output voltage (Vout), and decreasing the heating duty cycle will decrease the output voltage (Vout). Increasing the frequency will raise the average temperature of the pyroelectric capacitor 12. By operating at a larger temperature difference between the pyroelectric capacitor and ambient, the cooling cycle will be more efficient and should result in a higher output voltage (Vout).

The control circuit 22 also includes a diode 128 for providing charge recovery during cooling cycles. The diode 128 is connected between the pyroelectric capacitor 12 and a source that provides a recovery voltage (Vg). When the capacitor voltage (Vc) is greater than the output voltage (Vout), power is delivered to the output circuit 24. When the capacitor voltage (Vc) is less than the recovery voltage (Vg) during a cooling cycle, a current flows from the recovery voltage source, through the diode 128 and to the pyroelectric capacitor 12, whereby charge is recovered.

The sources that supply the reference voltage (Vref) and the recovery voltage (Vg) may be internal or external to the integrated circuit 112. The recovery voltage (Vg) could be set to a bias voltage (such as the normal low voltage power supply VDD) or some other recovery voltage to limit the lower level of voltage on the pyroelectric capacitor 12 and to help speed up the build-up of the capacitor voltage (Vc) during the heating cycle.

The control circuit 22 is neither recovering charge or charging the capacitor during the time period when the capacitor voltage (Vc) swings between the output voltage (Vout) and the recovery voltage (Vg). A higher recovery voltage (Vg) results in better efficiency of the power supply 10. It would be desirable to use the highest available power supply potential to set the reference voltage (Vg).

FIG. 5 shows a general method of using the circuit just described. Heat pulses are sent to the pyroelectric capacitor (210); capacitor voltage is compared to a reference voltage (212); and the heat pulses are adjusted in response to the comparison (214). The heat pulses may be adjusted by varying pulse width, amplitude, frequency, etc.

There are a number of applications for a high voltage source incorporated into a semiconductor chip. Applications include, without limitation, field emitter memory devices and radiation detectors.

The present invention is not limited to the specific embodiments described and illustrated above. Instead, the present invention is construed according to the claims that follow.

What is claimed is:

1. An integrated circuit comprising a regulated power supply including a pyroelectric capacitor.

2. The integrated circuit of claim 1, further comprising a heater, thermally coupled to the capacitor, and a circuit for causing the heater to apply heat pulses to the pyroelectric capacitor.

3. The integrated circuit of claim 2, wherein the heater includes a thin film dissipating element on a plate of the pyroelectric capacitor.

4. The integrated circuit of claim 3, further comprising a substrate and a thermal barrier on the substrate, the thin film dissipating element formed on the thermal barrier.

5. The integrated circuit of claim 2, wherein the circuit includes a voltage sense for sensing an output voltage of the power supply; a comparator for comparing the output voltage to a reference voltage; and a pulse generator for supplying pulses to the heater when the output voltage is less than the reference voltage.

6. The integrated circuit of claim 5, wherein the voltage sense includes a resistor ladder; and wherein the power supply further includes a rectifier for rectifying an output of the capacitor, the resistor ladder also forming a part of the rectifier.

7. The integrated circuit of claim 1, further comprising a circuit for balancing charge on the pyroelectric capacitor during cooling when power supply output voltage falls below a recovery voltage.

8. The integrated circuit of claim 7, wherein the circuit includes a diode connected between the capacitor and a recovery voltage terminal.

9. A regulated power supply comprising:

a pyroelectric capacitor;

a heat dissipating element in thermal communication with the pyroelectric capacitor; and a feedback circuit for sending electrical pulses to the dissipating element and adjusting the pulses to regulate an output of the power supply.

10. The power supply of claim 9, wherein the heater includes a thin film dissipating element on a plate of the pyroelectric capacitor.

11. The power supply of claim 9, wherein the feedback circuit includes a voltage sense coupled to the power supply output; a comparator for comparing an output of the voltage sense to a reference value; and a pulse generator for supplying pulses to the heat dissipating element when the output voltage is less than the reference voltage.

12. The power supply of claim 11, wherein the voltage sense includes a resistor ladder; and wherein the power supply further includes a rectifier for rectifying an output of the capacitor, the resistor ladder also forming a part of the rectifier.

13. The power supply of claim 9, further comprising a circuit for recovering charge on the pyroelectric capacitor during cooling when output voltage falls below a recovery voltage.

14. The power supply of claim 13, wherein the circuit includes a diode connected between the capacitor and a recovery voltage terminal.

15. A regulated power supply comprising:

a pyroelectric capacitor;

means for sending heat pulses to the capacitor;

means for comparing capacitor voltage to a reference voltage; and means for adjusting the heat pulses in response to the comparison.

16. A method of using a pyroelectric capacitor as a regulated power supply, the method comprising:

sending heat pulses to the capacitor;

comparing capacitor voltage to a reference voltage; and adjusting the heat pulses in response to the comparison.

17. The method of claim 16, wherein pulse width is adjusted.

18. The method of claim 16, wherein frequency of the heat pulses is adjusted.

19. The method of claim 16, wherein amplitude of the heat pulses is adjusted.

* * * * *